US008872427B2

(12) United States Patent
Itomura et al.

(10) Patent No.: US 8,872,427 B2
(45) Date of Patent: Oct. 28, 2014

(54) PLASMA GENERATING APPARATUS

(75) Inventors: Daisuke Itomura, Chiryu (JP);
Ryonosuke Tera, Kariya (JP); Yasuaki Hirokawa, Nagoya (JP); Hayato Nagaya, Chiryu (JP)

(73) Assignee: Denso Corporation, Kariya (JP)

( * ) Notice: Subject to any disclaimer, the term of this patent is extended or adjusted under 35 U.S.C. 154(b) by 54 days.

(21) Appl. No.: 13/282,918

(22) Filed: Oct. 27, 2011

(65) Prior Publication Data

US 2012/0119649 A1 May 17, 2012

(30) Foreign Application Priority Data

Nov. 16, 2010 (JP) ................................. 2010-255999

(51) Int. Cl.
*H01J 7/24* (2006.01)
*C23C 16/515* (2006.01)
*H05H 1/46* (2006.01)
*C23C 16/26* (2006.01)

(52) U.S. Cl.
CPC ................ *H05H 1/46* (2013.01); *C23C 16/515* (2013.01); *H05H 2001/4697* (2013.01); *C23C 16/26* (2013.01); *H05H 2001/4682* (2013.01)
USPC ............ 315/111.21; 315/111.01; 315/111.81; 315/111.41; 315/246

(58) Field of Classification Search
USPC ............................................ 315/246, 111.21
See application file for complete search history.

(56) References Cited

U.S. PATENT DOCUMENTS 5,932,116 A * 8/1999 Matsumoto et al. ..... 219/121.57
7,445,689 B2 * 11/2008 Yoshida et al. .......... 156/345.24

2002/0084032 A1 * 7/2002 Jeng et al. ................ 156/345.31
2002/0121345 A1 * 9/2002 Chen et al. ............... 156/345.48
2002/0174952 A1 * 11/2002 Maher et al. ............. 156/345.31
2005/0058172 A1 * 3/2005 Paetzel et al. .................... 372/55
2006/0208650 A1 * 9/2006 Kondou et al. .......... 315/111.21
2011/0248633 A1 * 10/2011 Nauman et al. .......... 315/111.21

FOREIGN PATENT DOCUMENTS

JP  A-59-177898   10/1984
JP  A-7-76781     3/1995
JP  A-10-340798   12/1998

(Continued)

OTHER PUBLICATIONS

Japanese Office Action issued in Japanese Application No. 2010-255999 dated Sep. 11, 2012 (w/translation).

(Continued)

*Primary Examiner* — Douglas W Owens
*Assistant Examiner* — Srinivas Sathiraju
(74) *Attorney, Agent, or Firm* — Oliff PLC

(57) ABSTRACT

A plasma generating apparatus includes: a power supply one of whose electrodes is connected to vacuum chamber walls of N vacuum chambers; an oscillator which outputs a pulse signal at every predetermined period; N pulse amplifying circuits which are connected in parallel to the oscillator as well as to the other electrode of the power supply, and each of which amplifies the pulse signal and supplies the amplified pulse signal to a corresponding one of N electrodes disposed in the N vacuum chambers; and at least (N-1) timing generating circuits which are connected between the oscillator and at least (N-1) pulse amplifying circuits, and which delay the pulse signal by respectively different delay times so that at any specific time, the pulse signal is supplied to only one of the pulse amplifying circuits.

3 Claims, 4 Drawing Sheets

(56) References Cited

FOREIGN PATENT DOCUMENTS

| JP | A-11-40395 | | 2/1999 |
| JP | 2003129234 A | * | 5/2003 |
| JP | A-2003-129234 | | 5/2003 |
| JP | 2007231424 A | * | 9/2007 |
| JP | A-2007-231424 | | 9/2007 |

OTHER PUBLICATIONS

Dec. 4, 2013 Office Action issued in Chinese Patent Application No. 201110362975.5 (with English-language translation).

* cited by examiner

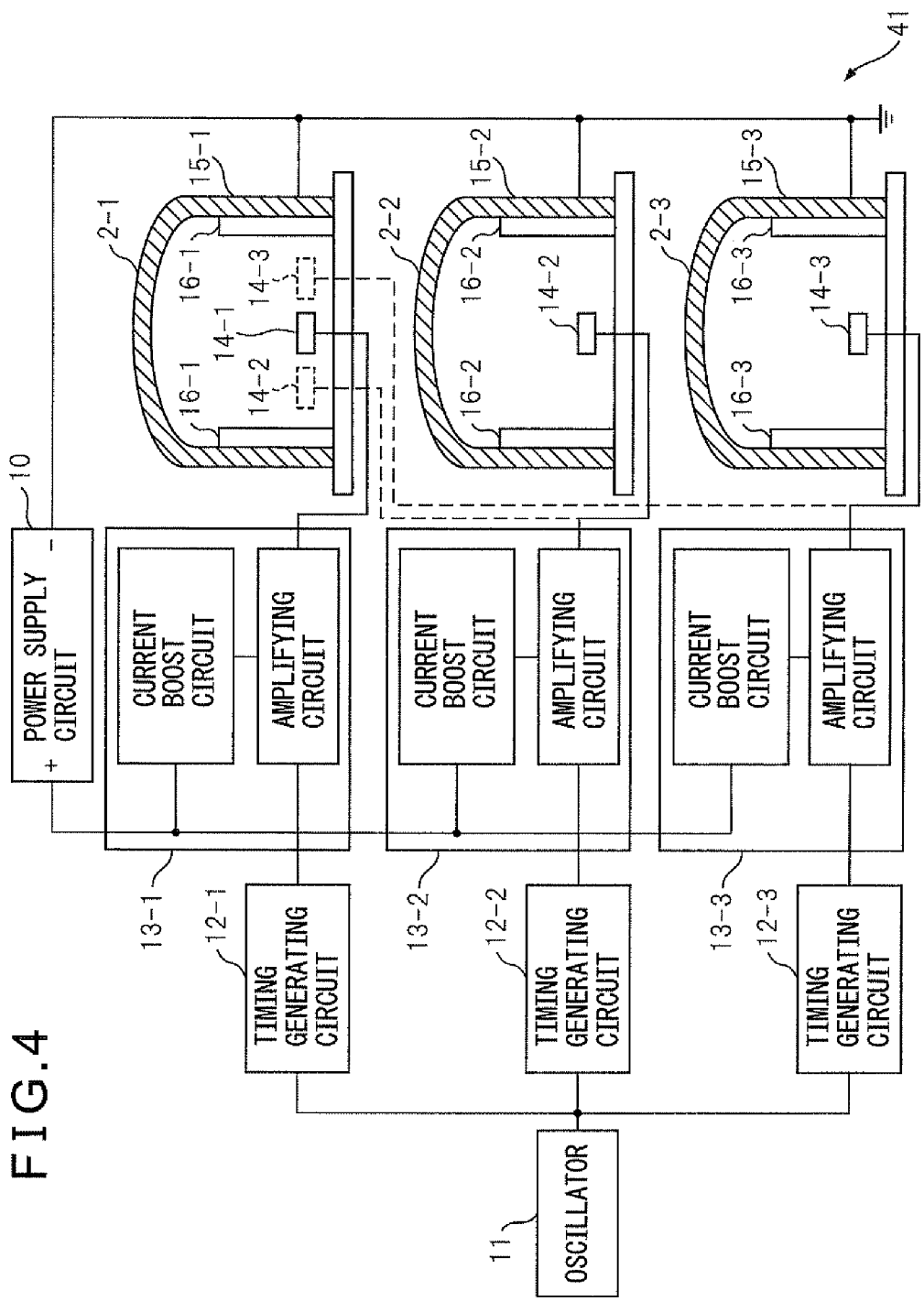

PLASMA GENERATING APPARATUS

CROSS-REFERENCE TO RELATED APPLICATION

This application is based upon and claims the benefit of priority of the prior Japanese Patent Application No. 2010-255999, filed on Nov. 16, 2010, and the entire contents of which are incorporated herein by reference.

FIELD

The present invention relates to a plasma generating apparatus.

BACKGROUND

Heretofore, plasma generating apparatus which generate reaction active sites by a plasma have been widely used for the processing of various materials, such as surface processing, thin-film deposition, and etching. For example, a plasma generating apparatus is used to deposit a film of a diamond-like carbon (DLC) on the surface of a substrate. The plasma generating apparatus creates a plasma state by ionizing a hydrocarbon gas, such as methane or acetylene, filled into a vacuum chamber, and uses the resulting reaction active species, such as radicals and ions, to deposit DLC films.

In the prior art, a technique is proposed that reduces the apparatus cost by making provisions so that power is supplied from a single power supply apparatus via a relay to a plurality of plasma generating apparatus provided one for each of a plurality of vacuum chambers or to a plurality of electrodes provided in a single vacuum chamber (for example, refer to Japanese Unexamined Patent Publication Nos. H10-340798, H11-40395, and 2003-129234).

For example, in the manufacturing process for manufacturing products in large quantities, it is preferable to be able to reduce the time required to process the products in order to increase productivity. It is therefore desirable to make provisions in such process steps as the film deposition using a plasma generating apparatus so that films can be deposited on the surfaces of a plurality of workpieces in a parallel and concurrent fashion.

However, the techniques disclosed in Japanese Unexamined Patent Publication Nos. H10-340798 and H11-40395 are intended so that, while performing processing using a plasma in one of the plurality of vacuum chambers, the transportation of workpieces, etc., can be carried out in the other vacuum chambers, and power from the power supply is supplied to one of the plurality of vacuum chambers via a relay. Accordingly, with these techniques, it is not possible to generate the plasma in the plurality of vacuum chambers simultaneously.

On the other hand, in the case of the technique disclosed in Japanese Unexamined Patent Publication No. 2003-129234, a plurality of pulse distribution supply means, provided one for each sputter evaporation source, are connected in parallel to a DC power supply, and each pulse distribution supply means includes a capacitor capable of storing power supplied from the power supply. According to this technique, by turning on a switch device incorporated in each pulse distribution supply means, a glow discharge can be generated between the negative electrode connected to the pulse distribution supply means and the positive electrode connected to the DC power supply.

Further, according to this technique, the switches are provided one for each sputter evaporation source and, by operating the switches to open and close at different timings under the control of a switch signal from a control mechanism, pulse-like power is supplied sequentially in a time-division fashion to the respective sputter evaporation sources. However, since this technique requires the provision of the control mechanism for adjusting the timing to supply power to the respective sputter evaporation sources, the apparatus configuration is complex.

SUMMARY

According to one embodiment of the present invention, a plasma generating apparatus for generating a plasma in each of N vacuum chambers is provided, where N is an integer not smaller than 2, by applying voltage between vacuum chamber walls of the N vacuum chambers and N electrodes disposed in the N vacuum chambers. The plasma generating apparatus includes: a power supply one of whose electrodes is connected to the vacuum chamber walls; an oscillator which outputs a pulse signal at every predetermined period; N pulse amplifying circuits which are connected in parallel to the oscillator as well as to the other electrode of the power supply, and each of which amplifies the pulse signal by using power supplied from the power supply and supplies the amplified pulse signal to a corresponding one of the N electrodes; and at least (N-1) timing generating circuits which are connected between the oscillator and at least (N-1) pulse amplifying circuits selected from among the N pulse amplifying circuits, and which delay the pulse signal by respectively different delay times so that during a period when the pulse signal is supplied to one of the N pulse amplifying circuits, the pulse signal is not supplied to any one of the other pulse amplifying circuits. With this configuration, the plasma generating apparatus can generate the plasma in the plurality of vacuum chambers in an alternating fashion, while serving to simplify the apparatus configuration. Further, since the power supply need not supply power to the plurality of pulse amplifying circuits simultaneously, and the power supply load can thus be reduced, the power supply can be constructed from substantially the same amount of circuitry as when only one pulse amplifying circuit was provided in the plasma generating apparatus. Accordingly, this plasma generating apparatus serves to simplify the configuration of the apparatus.

Preferably, the oscillator outputs as the pulse signal a signal that contains a short pulse that has a first voltage and a first duration and a long pulse that follows the short pulse and that has a second voltage whose magnitude is smaller than the first voltage and a second duration longer than the first duration. In this way, according to this plasma generating apparatus, a glow discharge is formed by first applying a short high-voltage pulse in the vacuum chamber, and thereafter, the voltage being applied in the vacuum chamber is reduced to a level at which the glow discharge can be sustained. Since this serves to prevent the occurrence of an arc discharge in the vacuum chamber, the plasma generating apparatus can generate the plasma in a stable manner.

Preferably, the predetermined period at which the oscillator outputs the pulse signal is set so that a plasma can be generated in each of the vacuum chambers by a transient phenomenon, even in a period between the end of application of the amplified pulse signal and the beginning of application of a subsequently amplified pulse signal. In this way, the plasma generating apparatus can generate the plasma in the plurality of vacuum chambers simultaneously.

According to another embodiment of the present invention, there is provided a plasma generating apparatus for generating a plasma in a vacuum chamber by applying voltage between a vacuum chamber wall of the vacuum chamber and N electrodes disposed in the vacuum chamber, where N is an integer not smaller than 2. In this embodiment also, the plasma generating apparatus includes: a power supply one of whose electrodes is connected to the vacuum chamber wall; an oscillator which outputs a pulse signal at every predetermined period; N pulse amplifying circuits which are connected in parallel to the oscillator as well as to the other electrode of the power supply, and each of which amplifies the pulse signal by using power supplied from the power supply and supplies the amplified pulse signal to a corresponding one of the N electrodes; and at least (N-1) timing generating circuits which are connected between the oscillator and at least (N-1) pulse amplifying circuits selected from among the N pulse amplifying circuits, and which delay the pulse signal by respectively different delay times so that during a period when the pulse signal is supplied to one of the N pulse amplifying circuits, the pulse signal is not supplied to any one of the other pulse amplifying circuits. Accordingly, this plasma generating apparatus can generate the plasma between the chamber wall and the respectively different electrodes in an alternating fashion within one vacuum chamber.

BRIEF DESCRIPTION OF DRAWINGS

These and other features and advantages of the present invention will be better understood by referring to the following detailed description, taken together with the drawings wherein:

FIG. 4 is a diagram schematically illustrating the configuration of a plasma generating apparatus according to another embodiment.

DETAILED DESCRIPTION OF EMBODIMENTS

A plasma generating apparatus according to one embodiment of the present invention will be described below with reference to the drawings. The plasma generating apparatus of this embodiment generates a plasma in each of a plurality of vacuum chambers by causing a glow discharge to occur between two electrodes provided in the vacuum chamber. In this plasma generating apparatus, a plurality of pulse amplifying circuits provided one for each of the vacuum chambers are connected in parallel to one power supply, and are also connected in parallel via respective timing generating circuits to one oscillator. Pulses generated by the oscillator are supplied to the pulse amplifying circuits at respectively different times via the respective timing generating circuits. Each pulse amplifying circuit amplifies the input pulses by using power supplied from the power supply, and applies the amplified pulses to the electrode in the vacuum chamber. By thus spreading out the power supply load in time, the plasma generating apparatus generates the plasma in the plurality of vacuum chambers, while allowing the use of a small power supply.

Figure 1:
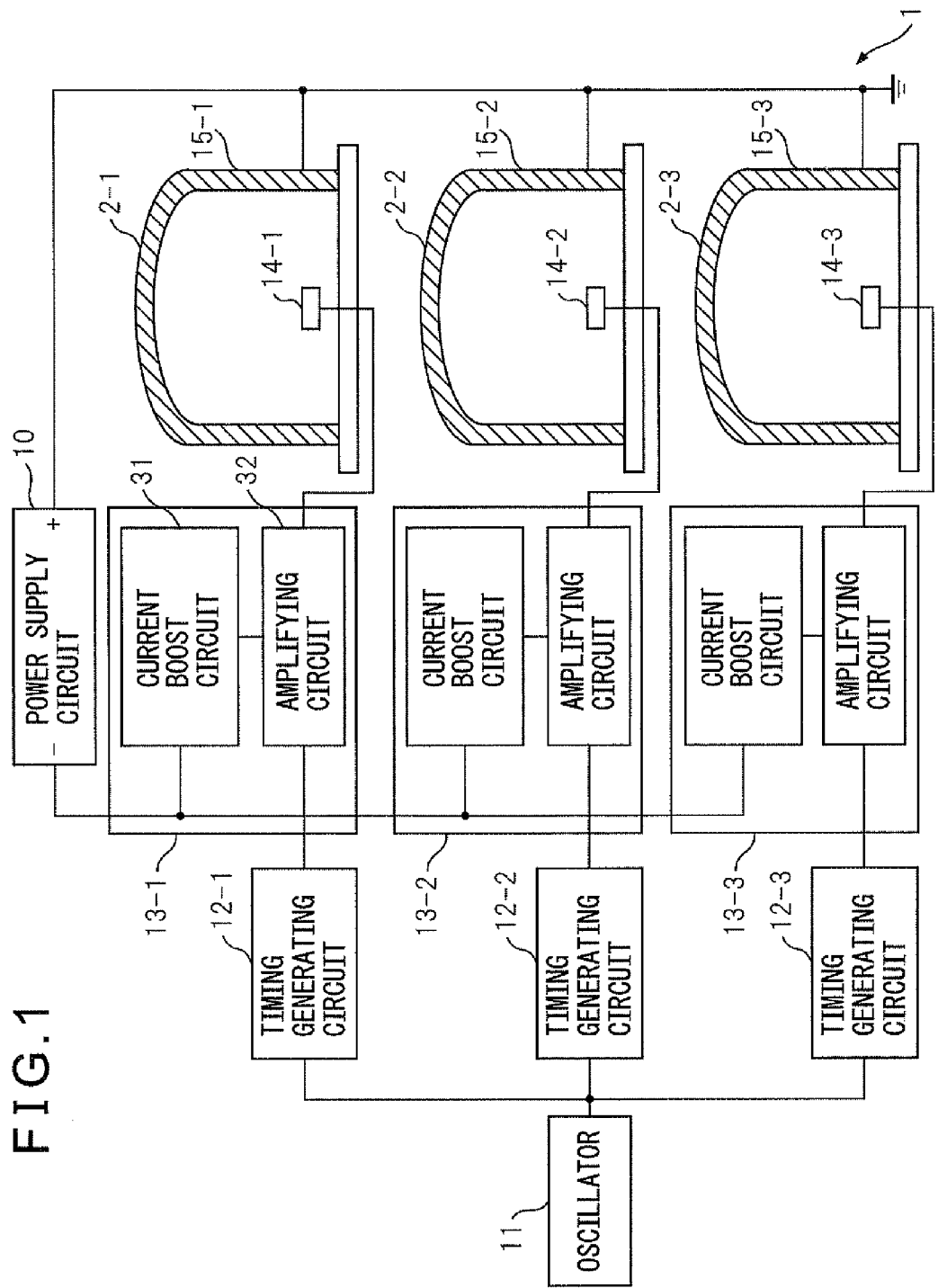
FIG. 1 is a diagram schematically illustrating the configuration of a plasma generating apparatus according to one embodiment of the present invention.

FIG. 1 is a diagram schematically illustrating the entire configuration of the plasma generating apparatus 1 according to the one embodiment of the present invention, which operates as a film deposition apparatus using a chemical vapor deposition (CVD) method. The plasma generating apparatus 1 includes three vacuum chambers 2-1 to 2-3, one power supply 10, one oscillator 11, three timing generating circuits 12-1 to 12-3, and three pulse amplifying circuits 13-1 to 13-3 provided one for each of the vacuum chambers.

Each of the vacuum chambers 2-1 to 2-3 includes an evacuating mechanism (not depicted) for evacuating the chamber, a pressure gauge (not depicted), and a process gas introducing mechanism (not depicted) for introducing into the vacuum chamber a process gas for supplying gas active species that provide the deposition source material. Each of the vacuum chambers 2-1 to 2-3 may further include a mechanism for transporting an electrode 14-1 to 14-3, formed by a deposition substrate (workpiece), into or out of the vacuum chamber.

The pulse amplifying circuits 13-1 to 13-3 are connected in parallel to the oscillator 11 via the respective timing generating circuits 12-1 to 12-3. Pulses generated by the oscillator 11 are supplied to the pulse amplifying circuits 13-1 to 13-3 via the respective timing generating circuits 12-1 to 12-3.

The pulse amplifying circuits 13-1 to 13-3 are also connected in parallel to the negative electrode of the power supply 10. Further, the pulse amplifying circuits 13-1 to 13-3 are connected to the electrodes 14-1 to 14-3 disposed in the respective vacuum chambers 2-1 to 2-3, for example, via leads passed through the insulators forming the bottoms of the respective vacuum chambers. Each of the pulse amplifying circuits 13-1 to 13-3 amplifies the input pulse signal by using power supplied from the power supply 10, and applies the amplified pulse signal to the corresponding one of the electrodes 14-1 to 14-3.

On the other hand, vacuum chamber walls 15-1 to 15-3 which are the inner walls of the respective vacuum chambers 2-1 to 2-3 are each formed from a conductive material, such as iron or copper, in the shape of a cylinder or a temple bell, for example, and are connected to the grounded electrode of the power supply 10. Therefore, the vacuum chamber walls 15-1 to 15-3 also function as electrodes, and when the pulse signal is applied to each of the electrodes 14-1 to 14-3, a glow discharge occurs between the electrode 14 and the corresponding one of the vacuum chamber walls 15-1 to 15-3, and a plasma of a process gas is thus generated in each vacuum chamber.

After the deposition workpieces are placed in the respective vacuum chambers 2-1 to 2-3, the vacuum chambers are evacuated. After that, the process gas is introduced into each of the vacuum chambers 2-1 to 2-3. An appropriate type of process gas is used according to the deposition active species. For example, a rare gas, a hydrocarbon gas, or an oxygen gas, or a mixture of two or more of these gases, is used as the process gas. More specifically, one of Ar, He, $N_2$, $O_2$, $H_2$, $CH_4$, $C_2H_2$, $C_2H_4$, $C_3H_8$, $CF_4$, $C_2F_6$, $SF_6$, $SiH_4$, $SiH_3Cl$, $SiH_2Cl_2$, $Si(CH_3)_4$, and $(CH_3)_3Si-NH-Si(CH_3)_3$, or a mixture of two or more of these gases, is used as the process gas.

After the process gas has been introduced, the pressure in each vacuum chamber is adjusted to a suitable pressure, for example, within the range of 100 to 101 kPa, by controlling the process gas introducing mechanism or the evacuating mechanism.

Then, the plasma generating apparatus 1 generates a plasma in each vacuum chamber by applying pulse-like DC power between the vacuum chamber walls 15-1 to 15-3 and the electrodes 14-1 to 14-3, and a film is formed on the surface of the workpiece by the active species produced by decomposing the gas in the plasma. For example, the workpiece is coated with DLC.

The various components of the plasma generating apparatus 1 will be described below.

The power supply 10 applies the DC voltage between each of the pulse amplifying circuits 13-1 to 13-3 connected in parallel to the negative electrode of the power supply 10 and the corresponding one of the vacuum chamber walls 15-1 to 15-3 connected in parallel to the positive electrode, i.e., the grounded electrode, of the power supply 10. The power supply 10 generates a voltage, for example, of about 300 V to 1 kV. The power supply 10, may be, for example, any one of various types of power supply apparatus commercially available for plasma generating apparatus.

The oscillator 11 generates a pulse signal at every predetermined period, and supplies the generated pulses to the pulse amplifying circuits 13-1 to 13-3 via the respective timing signal generating circuits 12-1 to 12-3. In the present embodiment, the pulse signal generated by the oscillator 11 contains a high-voltage short pulse that has a relatively high voltage and a relatively short duration and a low-voltage long pulse that follows the high-voltage short pulse and that has a voltage whose magnitude is smaller than the voltage of the high-voltage short pulse and a duration longer than that of the high-voltage short pulse.

This facilitates the formation of a glow discharge in the vacuum chamber, because a high voltage is first applied in the vacuum chamber. Since the voltage being applied in the vacuum chamber drops after the glow discharge has once been formed, the plasma generating apparatus 1 can suppress the occurrence of an arc discharge in the vacuum chamber. Accordingly, the plasma generating apparatus 1 can generate the plasma in the vacuum chamber in a stable manner. For example, the duration of the high-voltage short pulse is 1 μsec, while on the other hand, the duration of the low-voltage long pulse is 5 μsec. Further, the voltage of the high-voltage short pulse generated by the oscillator 11 is several volts, and the voltage of the low-voltage long pulse is about one-half of that of the high-voltage short pulse.

The pulse oscillation period here can be set equal to the product (Pt×N) of the pulse duration Pt and the number N of pulse amplifying circuits connected in parallel to the oscillator 11, or to the product (Pt×N) plus a prescribed offset period (for example, several microseconds).

Preferably, the pulse oscillation period is set so that the period between the end of the application of the pulse signal in the vacuum chamber and the beginning of the application of the next pulse signal is shorter than the period during which the state that can transiently generate the plasma persists. In this case, the oscillation period is set, for example, to several microseconds to several tens of microseconds. By so doing, the plasma generating apparatus 1 can generate the plasma in the plurality of vacuum chambers simultaneously.

Figure 2:
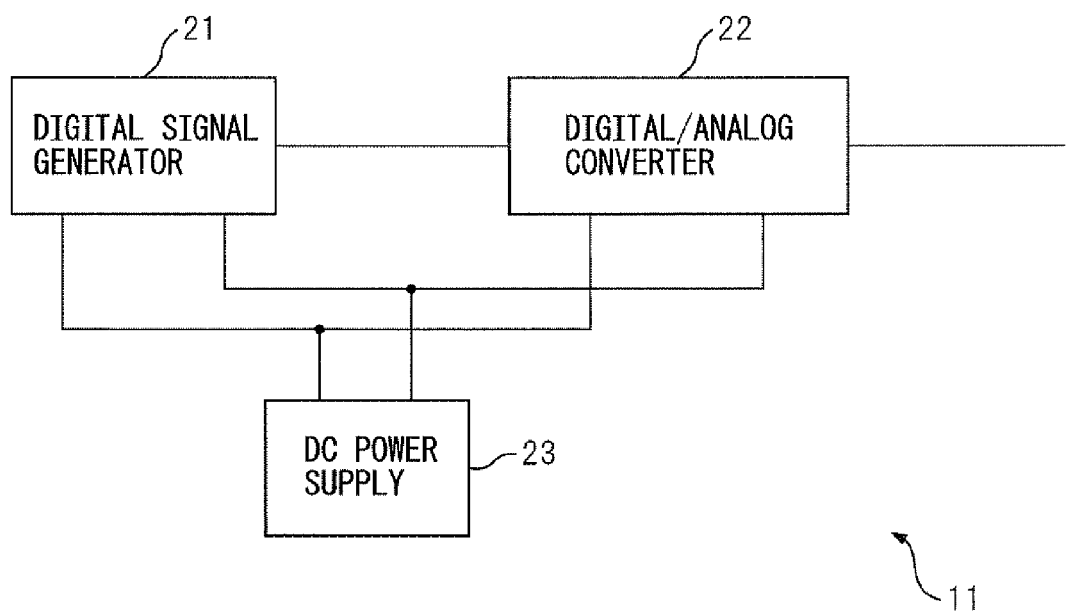
FIG. 2 is a circuit diagram of one example of an oscillator.

FIG. 2 is a circuit diagram of one example of the oscillator 11. The oscillator 11 includes a digital signal generator 21, a digital/analog converter 22, and a DC power supply 23.

The digital signal generator 21 includes, for example, an embedded-type processor and its peripheral circuitry, and operates on a drive voltage (for example, 5 V) supplied from the DC power supply 23. The digital signal generator 21 generates, at every predetermined period, a digital waveform signal containing a high-voltage short pulse and a low-voltage long pulse that follows it, and supplies the digital waveform signal to the digital/analog converter 22.

The digital/analog converter 22 is, for example, a resistor ladder type digital/analog converter, and converts the digital waveform signal into an analog pulse signal by using the drive voltage supplied from the DC power supply 23. The absolute value of the voltage of the high-voltage short pulse, contained in the pulse signal produced by the digital/analog converter 22, is, for example, 5 V, and the absolute value of the voltage of the low-voltage long pulse is, for example, 2.5 V. The digital/analog converter 22 supplies the pulse signal to each of the timing generating circuits 12-1 to 12-3. The oscillator 11 may be constructed from some other circuit that can periodically generate a pulse signal having a waveform that decays stepwise in two stages such as described above.

The timing generating circuits 12-1 to 12-3 receive the pulse signal from the oscillator 11 and output the pulse signal after delaying the received pulse signal by respectively different delay times.

Figure 3:
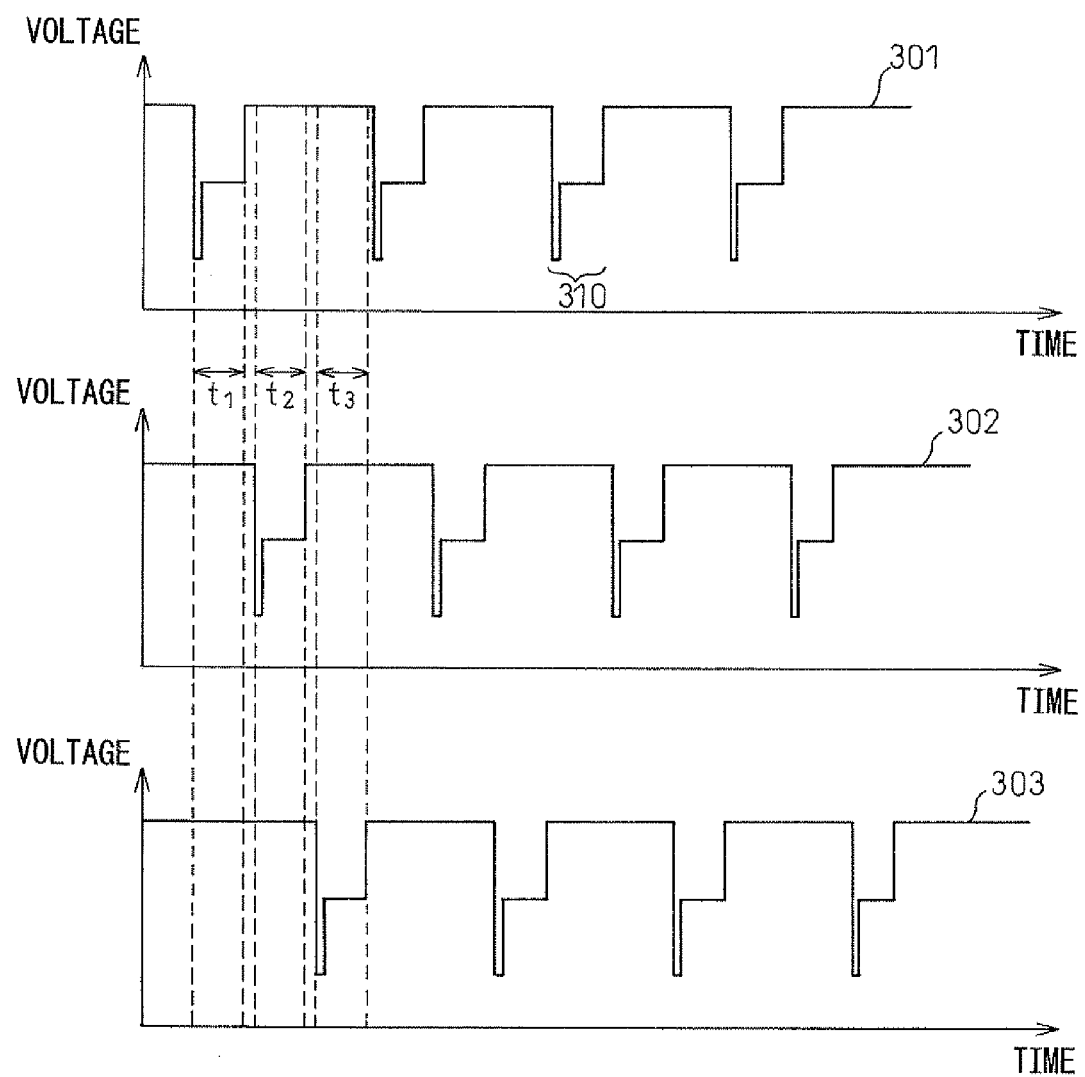
FIG. 3 is a time chart depicting voltage pulse waveforms applied to respective vacuum chambers.

FIG. 3 illustrates one example of the time chart of the pulse signals output from the respective timing generating circuits 12-1 to 12-3. In FIG. 3, the abscissa represents the time, and the ordinate the voltage. Graph 301 depicts the change with time of the voltage output from the timing generating circuit 12-1. Similarly, graph 302 depicts the change with time of the voltage output from the timing generating circuit 12-2. Further, graph 303 depicts the change with time of the voltage output from the timing generating circuit 12-3. In each of the graphs 301 to 303, the period during which the voltage changes stepwise in two stages constitutes one pulse signal 310. In this embodiment, since the pulse voltage is applied to the negative electrode of the vacuum chamber, the pulse signal 310 has a negative voltage value. That is, the voltage of the high-voltage short pulse is lower than the voltage of the low-voltage long pulse.

As illustrated in FIG. 3, the timing generating circuits 12-1 to 12-3 delay the pulse signal by respectively different delay times so that during the period when the pulse signal is supplied to one of the pulse amplifying circuits, the pulse signal is not supplied to any one of the other pulse amplifying circuits. For example, the timing generating circuit 12-1 supplies the pulse signal received from the oscillator 11 to the pulse amplifying circuit 13-1 after delaying the signal by several microseconds. On the other hand, the timing generating circuit 12-2 supplies the pulse signal to the pulse amplifying circuit 13-2 after delaying the received pulse signal by a period equal to the sum of the duration of the pulse signal output from the oscillator 11, the delay time of the timing generating circuit 12-1, and a prescribed offset (for example, several microseconds). Further, the timing generating circuit 12-3 supplies the pulse signal to the pulse amplifying circuit 13-3 after delaying the received pulse signal by a period equal to the sum of the duration of the pulse signal output from the oscillator 11, the delay time of the timing generating circuit 12-2, and the prescribed offset.

For example, in period $t_1$, the pulse signal is supplied only to the pulse amplifying circuit 13-1. Likewise, in period $t_2$, the pulse signal is supplied only to the pulse amplifying circuit 13-2. In period $t_3$, the pulse signal is supplied only to the pulse amplifying circuit 13-3. Since this prevents the load from being applied to the power supply 10 simultaneously from the plurality of pulse amplifying circuits, the power supply 10 can be constructed from substantially the same amount of circuitry as when only one pulse amplifying circuit was connected to the power supply circuit.

The pulse amplifying circuits 13-1 to 13-3 amplify the pulses received via the respective timing generating circuits. For this purpose, the pulse amplifying circuits 13-1 to 13-3 each include a current boost circuit 31 connected to the negative electrode of the power supply 10, and an amplifying circuit 32 which receives the pulses from the timing generating circuit and supplies the amplified pulses to the corresponding one of the electrodes 14-1 to 14-3.

The current boost circuit 31 amplifies the current flowing from the power supply 10 to the corresponding one of the electrodes 14-1 to 14-3. For example, the current boost circuit 31 amplifies the current so that a current of several milliamperes to several amperes flows between the vacuum chamber wall and the electrode when the pulse signal is applied to the electrode. The current boost circuit 31 may be, for example, any one of various known current boost circuits designed for use in plasma generating apparatus.

The amplifying circuit 32 amplifies the voltage of the pulse signal, while maintaining the waveform of the pulse signal. For example, the amplifying circuit 32 amplifies the voltage of the high-voltage short pulse in the pulse signal to about several hundred volts to 1 kV. Further, the amplifying circuit 32 amplifies the voltage of the low-voltage long pulse in the pulse signal to about one-half of the voltage of the amplified high-voltage short pulse. The amplifying circuit 32 may be, for example, any one of various known amplifying circuits that can handle a DC output voltage of several hundred volts to several kilovolts.

The amplifying circuit 32 supplies the amplified pulse signal to the corresponding one of the electrodes 14-1 to 14-3. When the high-voltage short pulse signal contained in the amplified pulse signal is applied to the electrode, a glow discharge occurs in the vacuum chamber. After that, the glow discharge is sustained in the vacuum chamber during the period when the amplified low-voltage long pulse signal is applied to the electrode. In this way, the plasma generating apparatus 1 can continuously generate the plasma of the process gas during the period when the amplified pulse signal is applied to the electrode. Further, since the voltage being applied to the electrode drops after the glow discharge has once been formed, an arc discharge is prevented from occurring in the vacuum chamber.

As described above, in the pulse generating apparatus, pulses generated by one oscillator are supplied to the pulse amplifying circuits via the respective timing generating circuits, connected in parallel to that oscillator, that introduce different delay times so that the pulses amplified by the pulse amplifying circuits are applied to the respective vacuum chambers in a staggered manner. Accordingly, in the plasma generating apparatus, since the load to the power supply can be reduced to substantially the same level as when only one pulse amplifying circuit was connected to the power supply circuit, the size and capacity of the power supply can be reduced. Furthermore, since the timing for applying the pulse signal to each vacuum chamber is adjusted by its associated timing generating circuit, the plasma generating apparatus eliminates the need for a complex control mechanism for controlling the timing. This serves to simplify the configuration of the plasma generating apparatus.

Furthermore, since the pulse signal having a two-stage waveform decaying stepwise is applied to each vacuum chamber, the plasma generating apparatus can not only easily generate a glow discharge in the vacuum chamber but can also prevent the occurrence of an arc discharge. As a result, the plasma generating apparatus can generate the plasma in each vacuum chamber in a stable manner.

The present invention is not limited to the above specific embodiment. For example, the number of vacuum chambers provided in the plasma generating apparatus is not limited to 3, but the plasma generating apparatus may include a suitable number of vacuum chambers, the number being 2 or more, according to the purpose.

Further, one of the plurality of pulse amplifying circuits may be connected to the oscillator directly, not via the timing generating circuit. More specifically, when N pulse amplifying circuits (N is an integer not smaller than 2) are connected in parallel to the power supply and the oscillator, the plasma generating apparatus has (N-1) timing generating circuits connected between the oscillator and (N-1) pulse amplifying circuits. In this case also, since each timing generating circuit can delay the timing of the pulse arriving at its associated pulse amplifying circuit, the plasma generating apparatus according to this modified example can achieve a similar effect to that achieved by the plasma generating apparatus according to the above embodiment.

The plasma generating apparatus according to the above embodiment or the modified example can be used in various applications where there is a need to generate a plasma in a vacuum chamber. For example, the plasma generating apparatus can also be applied as a film deposition apparatus that deposits film on work by physical vapor deposition (PVD).

FIG. 4 is a diagram schematically illustrating the configuration of a plasma generating apparatus according to another embodiment of the present invention, which operates as a PVD film deposition apparatus. The plasma generating apparatus 41 according to this embodiment includes three vacuum chambers 2-1 to 2-3, one power supply 10, one oscillator 11, three timing generating circuits 12-1 to 12-3, and three pulse amplifying circuits 13-1 to 13-3 provided one for each of the vacuum chambers.

The plasma generating apparatus 41 differs from the plasma generating apparatus 1 of FIG. 1 in that the electrodes 14-1 to 14-3, each formed by a deposition substrate which is a workpiece, are connected to the positive electrode of the power supply 10 via the respective pulse amplifying circuits 13-1 to 13-3. In this embodiment also, the vacuum chamber walls 15-1 to 15-3 are connected to the grounded electrode of the power supply 10. In this embodiment, targets 16-1 to 16-3 for supplying deposition material are electrically connected to the respective vacuum chamber walls 15-1 to 15-3. When the ions generated by ionizing the gas introduced into the vacuum chamber impinge on the target, particles dislodged from the target by the impact are deposited on the electrodes 14-1 to 14-3.

In the pulse generating apparatus 41 of this embodiment also, pulses generated by one oscillator are supplied to the pulse amplifying circuits via the respective timing generating circuits, connected in parallel to that oscillator, that introduce different delay times so that the pulses amplified by the pulse amplifying circuits are applied to the respective vacuum chambers in a staggered manner. Accordingly, this pulse generating apparatus 41 also can achieve a similar effect to that achieved by the pulse generating apparatus according to the above embodiment.

In this embodiment also, the number of vacuum chambers is not limited to 3. Further, as a modified example, the plurality of electrodes 14-1 to 14-3, each being a deposition workpiece and connected to one electrode of the power supply via one of the plurality of pulse amplifying circuits, may be disposed within one vacuum chamber, as indicated by dashed lines in FIG. 4. In this case, the electrodes connected to the respective pulse amplifying circuits, for example, may be formed from respectively different materials. In this modified example also, the vacuum chamber wall of the vacuum chamber is connected to the other electrode (grounded electrode) of the power supply. The plasma generating apparatus can thus deposit film on the plurality of workpieces.

As described above, any person skilled in the art can make various modifications without departing from the scope of the present invention.

What is claimed is:

1. A plasma generating apparatus for generating a plasma in each of N vacuum chambers, where N is an integer not smaller than 2, by applying voltage between vacuum chamber walls of said N vacuum chambers, and N electrodes, one of said N electrodes disposed in each of said N vacuum chambers, comprising:

a direct-current power supply, an electrode of the direct-current power supply being connected to said vacuum chamber walls;

an oscillator which outputs a pulse signal at every predetermined period;

N pulse amplifying circuits which are connected in parallel to said oscillator as well as to the other electrode of said direct-current power supply, and each of which amplifies said pulse signal to obtain a direct-current pulse signal by using power supplied from said direct-current power supply and supplies said direct-current pulse signal to a corresponding one of said N electrodes; and at least (N-1) timing generating circuits which are connected between said oscillator and at least (N-1) pulse amplifying circuits selected from among said N pulse amplifying circuits, and which delay said pulse signal by respectively different delay times so that during a period when said pulse signal is supplied to one of said N pulse amplifying circuits, said pulse signal is not supplied to any one of the other pulse amplifying circuits, wherein said oscillator outputs as said pulse signal a signal that contains a short pulse that has a first voltage and a first duration and a long pulse that follows said short pulse and that has a second voltage whose magnitude is smaller than said first voltage and a second duration longer than said first duration, and a voltage of said direct-current pulse signal during a period corresponding to said short pulse makes a glow discharge occur in said vacuum chambers, while a voltage of said direct-current pulse signal during a period corresponding to said long pulse makes the glow discharge be sustained and prevents an arc discharge from occurring in said vacuum chambers.

2. The plasma generating apparatus according to claim 1, wherein said predetermined period is set so that a plasma can be generated in each of said vacuum chambers by a transient phenomenon, even in a period between the end of application of said direct-current pulse signal and the beginning of application of a subsequent direct-current pulse signal.

3. A plasma generating apparatus for generating a plasma in a vacuum chamber by applying direct-current voltage between a vacuum chamber wall of said vacuum chamber and N electrodes disposed in said vacuum chamber, where N is an integer not smaller than 2, comprising:

a direct-current power supply, an electrode of the direct-current power supply being connected to said vacuum chamber wall;

an oscillator which outputs a pulse signal at every predetermined period;

N pulse amplifying circuits which are connected in parallel to said oscillator as well as to another electrode of said direct-current power supply, and each of which amplifies said pulse signal to obtain a direct-current pulse signal by using power supplied from said direct-current power supply and supplies said direct-current pulse signal to a corresponding one of said N electrodes; and at least (N-1) timing generating circuits which are connected between said oscillator and at least (N-1) pulse amplifying circuits selected from among said N pulse amplifying circuits, and which delay said pulse signal by respectively different delay times so that during a period when said pulse signal is supplied to one of said N pulse amplifying circuits, said pulse signal is not supplied to any one of the other pulse amplifying circuits, wherein said oscillator outputs as said pulse signal a signal that contains a short pulse that has a first voltage and a first duration and a long pulse that follows said short pulse and that has a second voltage whose magnitude is smaller than said first voltage and a second duration longer than said first duration, a voltage of said direct-current pulse signal during a period corresponding to said short pulse makes a glow discharge occur in said vacuum chamber, while a voltage of said direct-current pulse signal during a period corresponding to said long pulse makes the glow discharge be sustained and prevents an arc discharge from occurring in said vacuum chamber, and said predetermined period is set so that a plasma can be generated in said vacuum chamber by a transient phenomenon, even in a period between the end of application of said direct-current pulse signal and the beginning of application of a subsequent direct-current pulse signal.

* * * * *